United States Patent
Ha

(10) Patent No.: US 6,351,414 B1
(45) Date of Patent: Feb. 26, 2002

(54) BIAS STRUCTURE OF A FLASH MEMORY

(75) Inventor: Im Chul Ha, Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/721,673

(22) Filed: Nov. 27, 2000

(30) Foreign Application Priority Data

Dec. 27, 1999 (KR) .............................................. 99-62931

(51) Int. Cl.[7] .............................................. G11C 16/04
(52) U.S. Cl. .............................. 365/185.18; 365/185.23
(58) Field of Search ........................ 365/185.18, 185.23, 365/189.09, 226, 230.06

(56) References Cited

U.S. PATENT DOCUMENTS

| | | | | |
|---|---|---|---|---|
| 5,519,656 A | * | 5/1996 | Maccarrone et al. ... | 365/189.09 |
| 5,812,456 A | * | 9/1998 | Hull et al. .............. | 365/185.16 |
| 5,815,445 A | * | 9/1998 | Hull et al. .............. | 365/189.06 |
| 5,835,420 A | * | 11/1998 | Lee et al. ............... | 365/189.09 |
| 5,889,701 A | * | 3/1999 | Kang et al. ............ | 365/185.18 |
| 6,002,630 A | * | 12/1999 | Chuang et al. ............ | 365/226 |
| 6,122,205 A | * | 9/2000 | Yach ...................... | 365/189.06 |
| 6,128,242 A | * | 10/2000 | Bamba et al. .............. | 365/226 |
| 6,172,917 B1 | * | 1/2001 | Kataoka et al. ........ | 365/189.05 |

* cited by examiner

*Primary Examiner*—Michael S. Lebentritt
*Assistant Examiner*—Anh Phung
(74) *Attorney, Agent, or Firm*—Pennie & Edmonds LLP

(57) ABSTRACT

A bias structure of a flash memory comprises a word line pump for pumping a power supply in a program mode, and outputting the power supply in a read mode, a first voltage regulating unit for regulating the output voltage of the word line pump at a given voltage, in the program mode, and regulating the power supply at a specific level, in the read mode, thus outputting it, and a X decoder for supplying the output voltage from the first voltage regulating unit to a word line in a cell.

1 Claim, 2 Drawing Sheets

BIAS STRUCTURE OF A FLASH MEMORY

FIELD OF THE INVENTION

The invention relates generally to a flash memory, and more particularly to, a bias structure of a flash memory capable of reducing a chip size.

BACKGROUND OF THE INVENTION

Generally, a flash memory is set to have the highest voltage when reading the power supply supplied to a word line W/L, upon reading of the threshold voltage of the program cell.

FIG. 1 is a block diagram for explaining a bias structure in a conventional flash memory.

The conventional flash memory bias structure is consisted of a word line pump 11 for pumping the power supply Vcc, a first voltage regulating unit 12 for regulating the output voltage of the word line pump 11, a X decoder 30 for supplying the output from the first voltage regulating unit 12 to a word line W/L in a flash cell M1, a drain pump 21 for pumping the drain of the flash cell M1 and a second voltage regulating unit 22 for regulating the output voltage from the drain pump 21.

The above word line pump 11 pumps the supply power Vcc in a program mode (program signal PGM is at High signal), whereas it outputs the supply power Vcc intact in a read mode (program signal PGM is at Low signal). The first voltage regulating unit 12 regulates the voltage pumped by the word line pump 11 to VPPX during a program mode, whereas it outputs the supply power Vcc outputted from the word line pump 11 to the X decoder 30, without regulating the voltage during a read mode.

The drain pump 21 pumps the supply power Vcc using an enable signal EN. The second regulating unit 22 regulates the voltage pumped by the drain pump 21 to VPPD, using the enable signal EN, and then supplies it to the drain D of the cell M1.

In order to down-regulate the threshold voltage of the program cell, the conventional flash memory bias structure regulates the supply power to a specific level upon reading and then applies the regulated voltage to a selected word line W/L, so that the threshold voltage of the program cell can be down-regulated. However, the conventional bias structure includes a drain pump in order to supply the drain voltage to the drain of the cell. Therefore, the conventional bias structure has drawbacks that the chip size is increased and the consumption power is great.

SUMMARY OF THE INVENTION

It is therefore an object of the present invention to provide a bias structure of a flash memory capable of consumption power and chip size.

In order to accomplish the above object, a bias structure of a flash memory according to the present invention is characterized in that it comprises a word line pump for pumping a power supply, in a program mode, and outputting the power supply, in a read mode, a first voltage regulating unit for regulating the output voltage of the word line pump at a given voltage, in the program mode, and regulating the power supply at a specific level, in the read mode, thus outputting it, and a X decoder for supplying the output voltage from the first voltage regulating unit to a word line in a cell.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
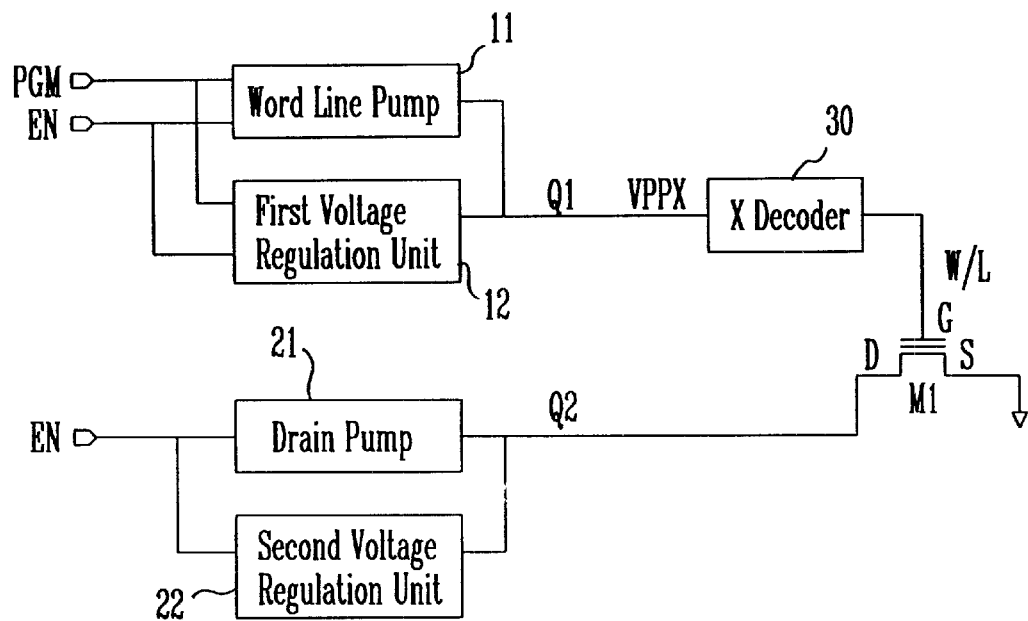
FIG. 1 is a block diagram for explaining a bias structure in a conventional flash memory.
Figure 2:
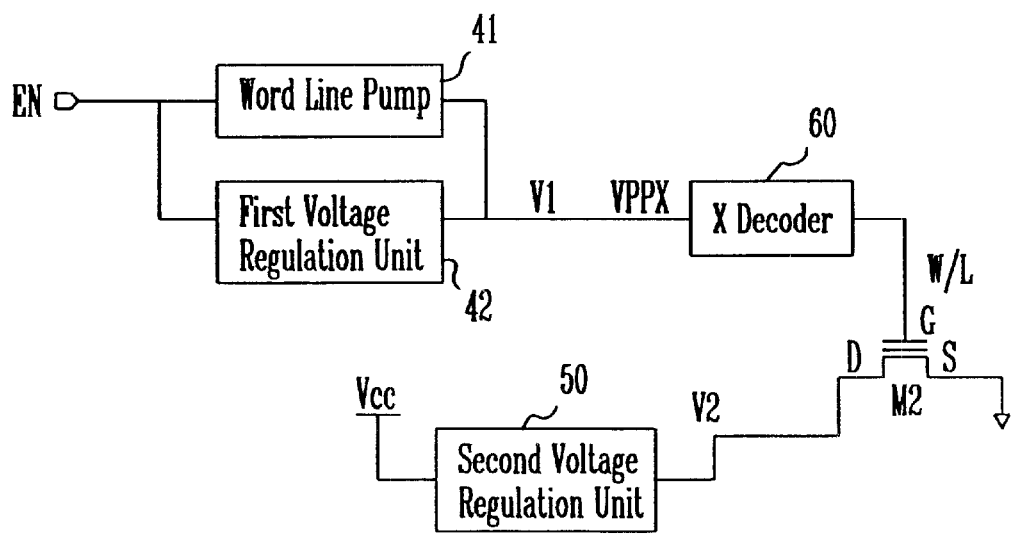
FIG. 2 is a block diagram for explaining a bias structure of a flash memory according to the present invention.

FIG. 2 is a block diagram for explaining a bias structure of a flash memory according to the present invention.

The flash memory bias structure according to the present invention includes a word line pump 41 for pumping the power supply Vcc, a first voltage regulating unit 42 for regulating the output voltage of the word line pump 41, a X decoder 60 for supplying the output from the first voltage regulating unit 42 to a word line W/L in a flash cell M2, and a second voltage regulating unit 50 for regulating the power supply Vcc to supply the regulated voltage as the drain of the flash cell M2.

In a program mode (program signal PGM is at High signal), the word line pump 41 pumps the power supply Vcc, and the first voltage regulating unit 42 then regulates the voltage pumped by the word line pump 41 at a give level to output the regulated voltage to the X decoder 60. Then, the X decoder 60 applies the voltage regulated by the word line pump 42 to the word line in the cell M2.

At this time, in order to regulate the threshold voltage of the cell M2, the second voltage regulating unit 50 regulates the power supply Vcc at a specific level (when the power supply is 5 V, about 4.5 V being the minimum value) to thus provide the regulated voltage with the drain of cell M2. As a result, the present invention can not only increase the program speed but also reduce consumption power because it performs the pumping operation.

On the other hand, in a read mode, the word line pump 41 outputs the power supply Vcc without pumping it. The first voltage regulating unit 42 regulates the power supply Vcc outputted from the word line pump 41 at a given level, thus to output the regulated voltage to the X decoder 60. The X decoder 60 applies the voltage regulated by the word line pump 42 to the word line in the cell M2. At this time, in order to down-regulate the threshold voltage of the cell M2, the second voltage regulating unit 50 regulates the power supply Vcc at a specific level (when the power supply is 5 V, about 4.5 V being the minimum value), thus to provide the regulated voltage with the drain of cell M2, as mentioned above. As a result, the present invention can improve the sensing margin of the cell M2.

Figure 3:
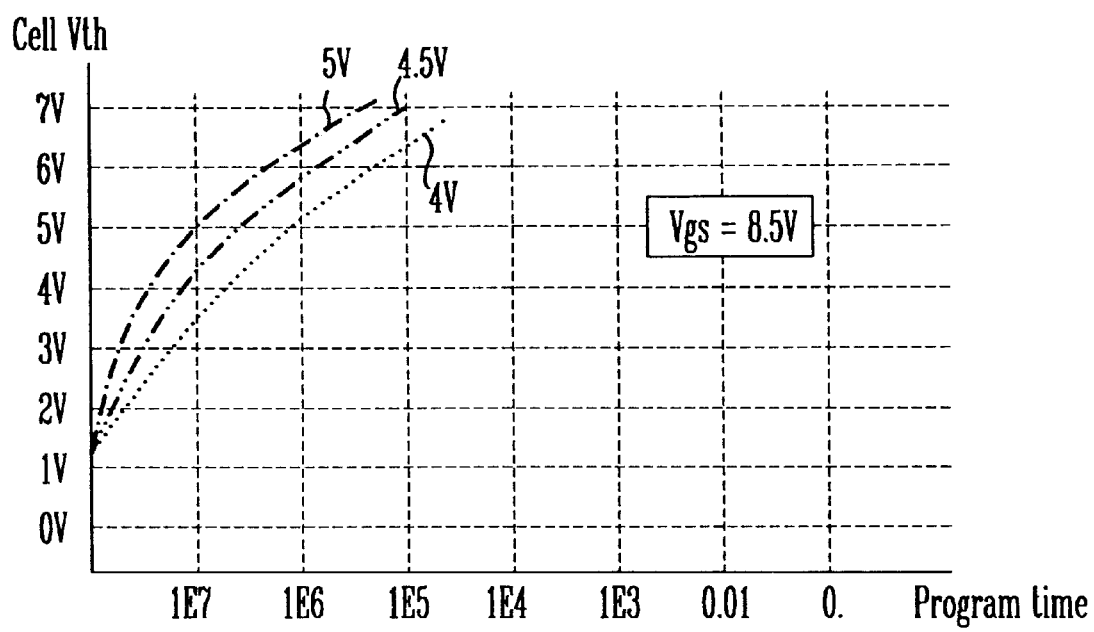
FIG. 3 is a simulation waveform of a bias structure of a flash memory.

FIG. 3 is a simulation waveform of a bias structure of a flash memory.

In order to down-regulate the threshold voltage of the cell M2, the second voltage regulating unit 50 regulates the power supply Vcc at a specific level (when the power supply is 5 V, about 4.5 V being the minimum value), thus to provide the regulated voltage with the drain of cell M2. Accordingly, it can be seen from FIG. 3 that the program time is reduced by log scale.

As mentioned above, the bias structure of the flash memory according to the present invention regulates the power supply to supply the regulated voltage as a drain voltage without any additional pumping unit. Thus, the present invention can not only improve the program speed and sensing margin but also reduce the chip size to about 5%.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:
1. A bias structure of a flash memory in a program mode, comprising:
   a word line pump for pumping a power supply in the program mode;
   a first voltage regulating unit for regulating an output voltage of said word line pump at a given voltage in the program mode;
   an X decoder for supplying the output voltage from said first voltage regulating unit to a word line in a cell; and
   a second voltage regulating unit for regulating said power supply at a specific level which is lower than a level of said power supply and outputting the regulated power supply to a drain of the cell in the program mode.

* * * * *